(12) United States Patent
Nakazato et al.

(10) Patent No.: US 8,004,434 B2
(45) Date of Patent: Aug. 23, 2011

(54) RD CONVERTER AND ANGLE DETECTING APPARATUS

(75) Inventors: Kenichi Nakazato, Tokyo (JP); Masayuki Watanabe, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 7 days.

(21) Appl. No.: 12/684,048

(22) Filed: Jan. 7, 2010

(65) Prior Publication Data

US 2010/0176975 A1 Jul. 15, 2010

(30) Foreign Application Priority Data

Jan. 15, 2009 (JP) ................. 2009-006909

(51) Int. Cl.
*H03M 1/48* (2006.01)
(52) U.S. Cl. .................. 341/115; 324/207.25
(58) Field of Classification Search .......... 341/112, 341/115; 318/605, 654, 661
See application file for complete search history.

(56) References Cited

U.S. PATENT DOCUMENTS

| | | | | |
|---|---|---|---|---|
| 4,340,939 | A * | 7/1982 | Mayer | 341/115 |
| 5,739,659 | A * | 4/1998 | Ezuka | 318/605 |
| 5,760,562 | A * | 6/1998 | Woodland et al. | 318/632 |
| 6,278,388 | B1 * | 8/2001 | Kushihara | 341/112 |
| 6,608,573 | B2 | 8/2003 | Kushihara | |
| 2006/0061306 | A1 * | 3/2006 | O'Gorman et al. | 318/105 |

FOREIGN PATENT DOCUMENTS

| | | |
|---|---|---|
| JP | H01-174914 | 7/1989 |
| JP | 10-170531 | 6/1998 |
| JP | 2002-131083 | 5/2002 |

OTHER PUBLICATIONS

Office Action issued on Nov. 24, 2010 by the Japanese Patent Office for counterpart foreign patent application JP 2009-006909.
Extended European Search Report issued on Jan. 20, 2011 by the European Patent Office for counterpart foreign patent application EP 10 150 792.9.
S.K. Kaul, et al., "Improving the accuracy of low-cost resolver-based encoders using harmonic analysis," Nuclear Instruments & Methods in Physics Research, Section A: Accelerators, Spectrometers, Detectors and Associated Equipment, Elsevier, Amsterdam, vol. 586, No. 2, Jan 7, 2008, pp. 345-355.

* cited by examiner

*Primary Examiner* — Howard Williams
(74) *Attorney, Agent, or Firm* — David N. Lathrop

(57) ABSTRACT

An RD converter is disclosed that has a first multiplier multiplying a resolver signal S1 by an output of a SIN ROM; a second multiplier multiplying a resolver signal S2 by an output of a COS ROM; a subtractor subtracting an output of the first multiplier from an output of the second multiplier; a synchronous detecting circuit detecting synchronously an output of the subtractor with reference to an excitation signal; a controller controlling an output angle θ' to make an output of the synchronous detecting circuit equal to zero; a correction data part outputting a correction angle $θ_c$ for the output angle θ'; an adder adding the output angle θ' and the correction angle $θ_c$; the SIN ROM producing a sine value of a result from the adder; and the COS ROM producing a cosine value of the result.

3 Claims, 12 Drawing Sheets

|  | AMPLITUDE | PHASE[°] |
|---|---|---|
| 1st HARMONIC | 0.7 | -50 |
| 2nd HARMONIC | 0.1 | 150 |
| 4th HARMONIC | 0.2 | -30 |

RD CONVERTER AND ANGLE DETECTING APPARATUS

BACKGROUND OF THE INVENTION

1. Field of the Invention

The present invention relates to an RD converter that converts resolver signals output from a resolver that detects a rotational angle of a motor into a digital output angle, and an angle detecting apparatus provided with the RD converter.

2. Description of the Related Art

In general, a resolver has an angle error, and the angle error has to be corrected in order to achieve precise angle detection.

A method of correcting the angle error of the resolver is described in Patent literature 1. According to the method described in Patent literature 1, angle error characteristics of the resolver are previously calculated based on comparison between output angles of the RD converter obtained by rotating the resolver at a constant number of revolutions and an angle data reference determined based on time measurement of the rotation of the resolver and recorded in a correction memory. The angle error characteristics are recorded in the correction memory in the form of corrected angles for the output angles of the RD converter.

Patent literature 1: Japanese Patent Application Laid-Open No. H10-170531

In operation, the output angle of the RD converter is input to the correction memory, the corrected angle associated with the output angle is output from the correction memory, and thus, an angle corrected for the angle error is acquired.

As described above, according to the method described in Patent literature 1, the angle error of the resolver is corrected by correcting the output angle of the RD converter. However, the characteristics of the angle error of the resolver having passed through the RD converter vary depending on the number of revolutions of the resolver, and the correction method described in Patent literature 1 is not designed for the angle error that varies depending on the number of revolutions and therefore cannot correct the angle error.

In addition, since the correction memory has to store the corrected angles and thus requires a high capacity. For example, when the resolution of the output angle of the RD converter is 12 bits, the correction memory has to have a memory capacity of 49152 bits ($2^{12} \times 12$ bits), because the memory has to store the corrected angle for each output angle.

SUMMARY OF THE INVENTION

In view of such circumstances, an object of the present invention is to provide an RD converter that can precisely correct an angle error of a resolver even when the characteristics of the angle error vary depending on the number of revolutions of the resolver and can reduce the capacity of a memory used for correction compared with the conventional and to provide an angle detecting apparatus provided with the RD converter.

An RD converter according to the present invention is an RD converter that converts a detection angle θ indicated by resolver signals S1 and S2 output from a one phase excitation/two phase output resolver into a digital output angle θ', comprising: a first multiplier that multiplies the resolver signal S1 by an output of a SIN ROM; a second multiplier that multiplies the resolver signal S2 by an output of a COS ROM; a subtractor that subtracts an output of the first multiplier from an output of the second multiplier; a synchronous detecting circuit that synchronously detects an output of the subtractor with reference to an excitation signal; a controller that controls the digital output angle θ' to make an output of the synchronous detecting circuit equal to 0 and outputs the controlled digital output angle θ'; a correction data part that receives the digital output angle θ' and outputs a correction angle for the digital output angle θ'; an adder that adds the digital output angle θ' and the correction angle and outputs the sum to the SIN ROM and the COS ROM; the SIN ROM that produces a sine value of the sum and outputs the sine value; and the COS ROM that produces a cosine value of the sum and outputs the cosine value.

An angle detecting apparatus according to the present invention comprises: a one phase excitation/two phase output resolver; the RD converter described above; and an excitation signal generator that supplies an excitation signal to the resolver and the RD converter.

EFFECTS OF THE INVENTION

The RD converter according to the present invention corrects the angle error of the resolver in the angle calculation loop. That is, the output angle of the RD converter and the correction angle are added to each other, and the sum angle is fed back. Thus, even when the angle error characteristics of the resolver vary depending on the number of revolutions of the resolver, the angle error can be precisely corrected.

In addition, according to the present invention, unlike the conventional art, the corrected angles do not have to be recorded, and only the error (difference between the true angle and the output angle of the resolver) has to be recorded. Thus, the required memory capacity can be reduced.

DETAILED DESCRIPTION

First, an angle calculation principle of a resolver and an RD converter will be described.

Figure 1:
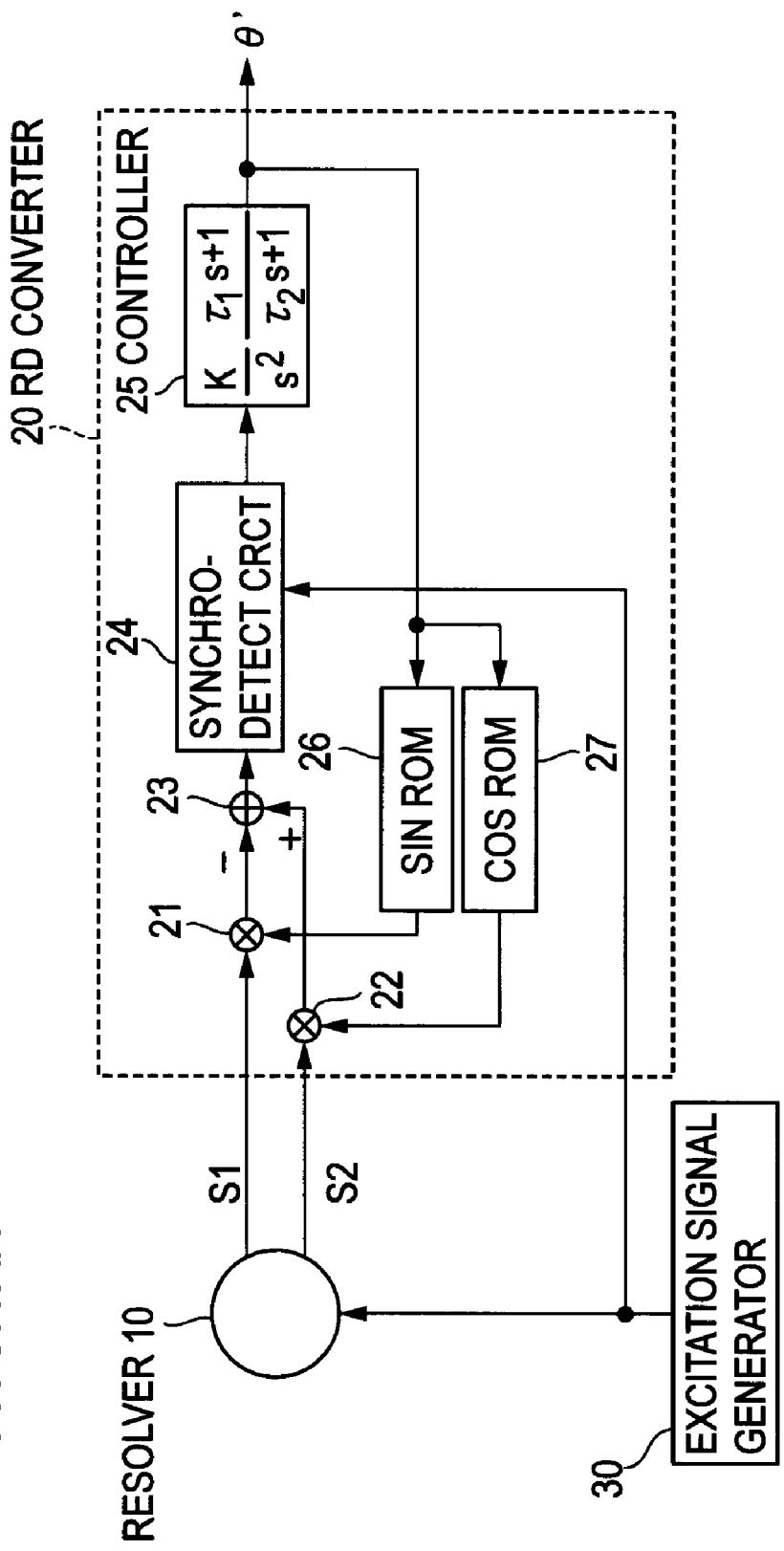
FIG. 1 is a block diagram showing an exemplary basic configuration of an RD converter and an angle detecting apparatus.

FIG. 1 is a diagram showing a basic configuration of an RD converter along with a resolver and an excitation signal generator.

A resolver 10 is an one phase excitation/two phase output resolver, and a first resolver signal S1 and a second resolver signal S2 output from the resolver 10 are input to an RD converter 20. In addition, an excitation signal is input from an excitation signal generator 30 to the resolver 10 and the RD converter 20. Assuming that the excitation signal is sin ωt, the resolver signals S1 and S2 are expressed as follows.

S1: cos θ sin ωt

S2: sin θ sin ωt

θ represents a detection angle of the resolver 10. In this example, the RD converter 20 comprises a first multiplier 21, a second multiplier 22, a subtractor 23, synchronous detecting circuit 24, a controller 25, a SIN ROM 26, and a COS ROM 27. The RD converter 20 converts the detection angle θ indicated by the resolver signals S1 and S2 into a digital output angle θ' through an angle calculation loop formed by the components listed above and outputs the digital output angle θ'.

The digital output angle θ' is input to the SIN ROM 26, and the SIN ROM 26 produces a sin θ' which is a sine value of the digital output angle θ' and outputs the sin θ' to the multiplier 21. Similarly, the COS ROM 27 produces a cos θ' which is a cosine value of the digital output angle θ' and outputs the cos θ' to the multiplier 22.

The multiplier 21 multiplies the resolver signal S1 by sin θ', and outputs the product to the subtractor 23. The multiplier 22 multiplies the resolver signal S2 by cos θ' and outputs the product to the subtractor 23. The subtractor 23 subtracts the output of the multiplier 21 from the output of the multiplier 22 and outputs the difference to the synchronous detecting circuit 24. The signal input from the subtractor 23 to the synchronous detecting circuit 24 is expressed as follows.

sin ω*t*(sin θ cos θ'−cos θ sin θ')=sin ω*t* sin(θ−θ')

The synchronous detecting circuit 24 synchronously detects this signal with reference to the excitation signal sin ωt input from the excitation signal generator 30 and eliminates sin ωt from the signal to output a deviation sin(θ−θ') as a detection output to the controller 25. The controller 25 adjusts the digital output angle θ' to make the deviation sin (θ−θ') equal to 0. As a result, θ equals to θ', and the controller 25 converts the detection angle θ into the digital output angle θ' and outputs the digital output angle θ'. As shown in FIG. 1, the transfer function of the controller 25 is expressed as $(K/s^2)*\{(\tau_1 s+1)/(\tau_2 s+1)\}$. $K$, $\tau_1$ and $\tau_2$ are coefficients of the transfer function. s represents the Laplace operator. An asterisk * denotes multiplication.

In the case where θ≈θ', the output of the synchronous detecting circuit 24 can be simplified as follows.

sin(θ−θ')=θ−θ'

Figure 2:
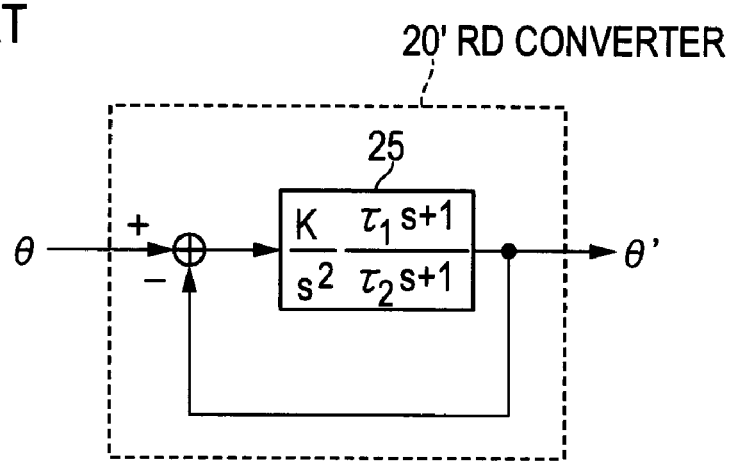
FIG. 2 is a block diagram showing a simplification of the configuration shown in FIG. 1.

Therefore, the configuration shown in FIG. 1 can be simplified as shown in FIG. 2.

Next, angle error characteristics of the resolver will be described.

Figure 3:
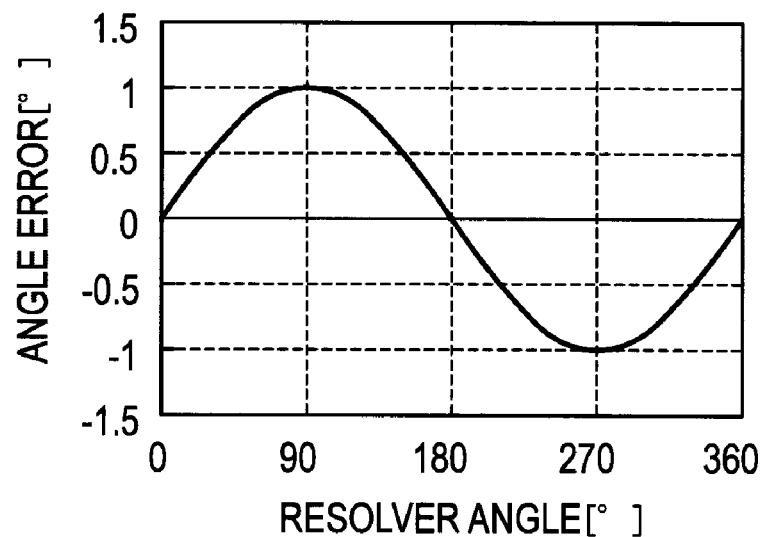
FIG. 3 is a graph showing exemplary characteristics of the angle error of a resolver (the fundamental frequency component)

The angle error of the resolver depends on the resolver angle. FIG. 3 shows an example of this relationship. The angle error actually has an integral multiple frequency component of the number of revolutions of the resolver as described later with reference to FIG. 16. However, for simplification of explanation, only the fundamental frequency component is shown here.

Assuming that an ideal resolver angle without error is $\theta_t$, and the angle error shown in FIG. 3 is denoted by $\theta_e$. When the resolver rotates at a number of revolutions V rps, the detection angle θ of the resolver is expressed as follows.

$\theta_t = 360 \times V \times t$ (t: time[s])

$\theta_e = \sin \theta_t$ $\theta = \theta_t + \theta_e$

Next, the output of an RD converter 20' shown in FIG. 2 in the case where the value θ is input to the RD converter 20' will be described.

Figure 4A:
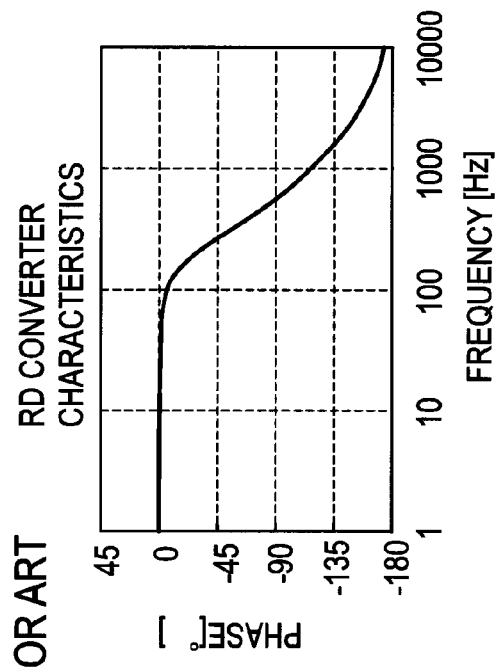
FIG. 4A is a characteristics view showing a relationship between a frequency and a gain in the RD converter shown in FIG. 2.
Figure 4B:
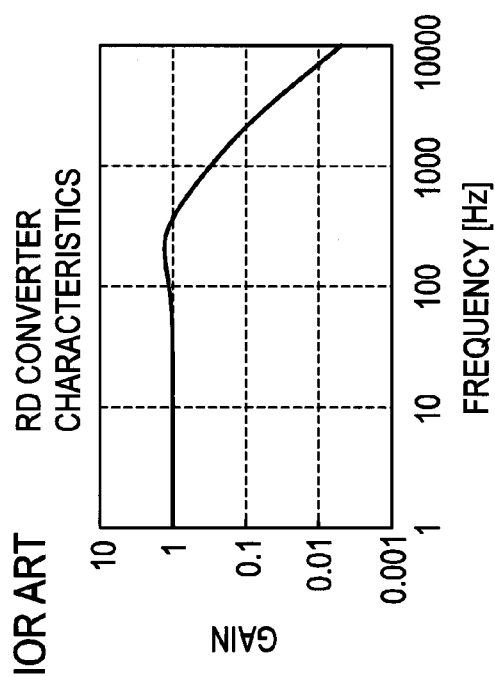
FIG. 4B is a characteristics view showing a relationship between a frequency and a phase in the RD converter shown in FIG. 2.

The characteristics of the RD converter 20' are as shown in FIGS. 4A and 4B in the case where coefficients of the transfer function of the controller 25 shown in FIG. 2 are, for example, as follows.

$K = 2 \times 10^6$ $\tau_1 = 1 \times 10^{-3}$ $\tau_2 = 1 \times 10^{-4}$

The response of the RD converter 20' in the case where the ideal resolver angle $\theta_t$ without error is input to the RD converter 20' is as follows.

Figure 5A:
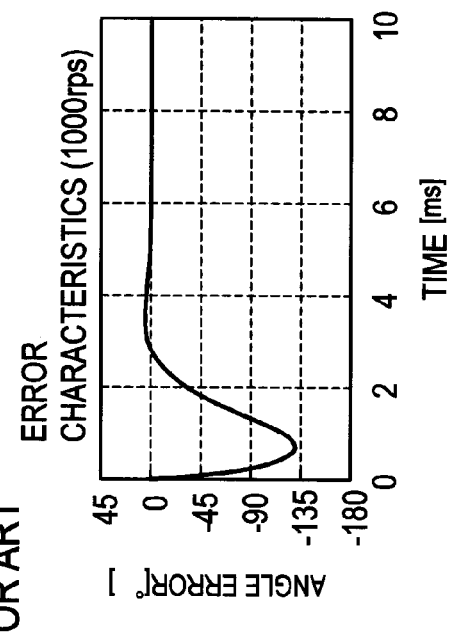
FIG. 5A is a graph showing the output angle of the RD converter having the characteristics shown in FIG. 4 in response to input of an error-free resolver angle $\theta_r$.
Figure 5B:
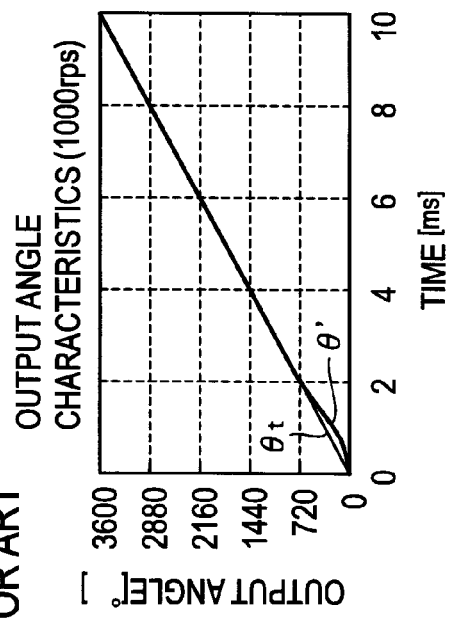
FIG. 5B is a graph showing the output angle error of the RD converter having the characteristics shown in FIG. 4 in response to input of an error-free resolver angle $\theta_r$.

The RD converter 20' has second-order characteristics, and therefore, if the number of revolutions V is constant, the difference between the resolver angle $\theta_t$ and the output angle θ' becomes equal to 0 after a certain length of time. FIGS. 5A and 5B show the resolver angle $\theta_t$ and the response of the output angle θ' of the RD converter 20' in the case where the number of revolutions of the resolver is 1000 rps, and the angle error (θ'−$\theta_t$) in this case.

On the other hand, the response of the RD converter 20' in the case where the angle error $\theta_c$ is input to the RD converter 20' is as follows.

Figure 6A:
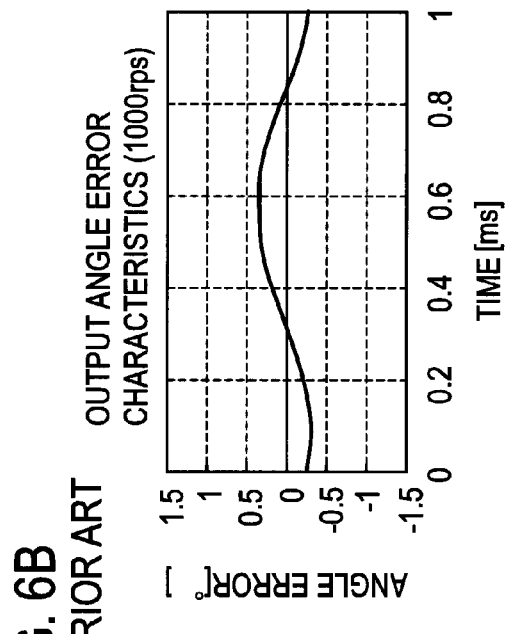
FIG. 6A is a graph showing the output angle (angle error) of the RD converter having the characteristics shown in FIG. 4 in response to input of an angle error $\theta_e$ at a rate of 10 rps.
Figure 6B:
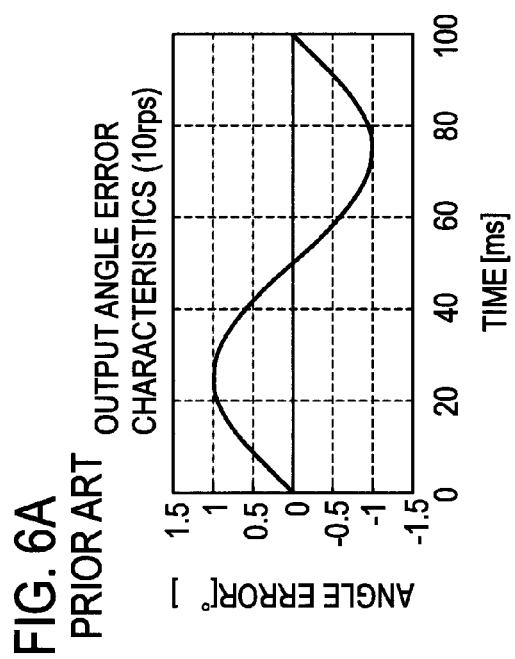
FIG. 6B is a graph showing the output angle (angle error) of the RD converter having the characteristics shown in FIG. 4 in response to input of an angle error $\theta_e$ at a rate of 1000 rps.

The angle error $\theta_e$, which is expressed as $\theta_e=\sin\theta_t$, periodically varies, and therefore, the output characteristics varies depending on the input frequency. When the resolver rotates at 1000 rps, the angle error $\theta_e$ is a signal of 1000 Hz. If this signal is input to the RD converter 20', the amplitude is 0.3 times as high as that shown in FIGS. 4A and 4B, and the phase is delayed by 117 degrees from that shown in FIG. 4. FIGS. 6A and 6B show responses in the cases where the number of revolutions of the resolver is 10 rps and where the number of revolutions of the resolver is 1000 rps. As can be seen from the drawings, the characteristics of the angle error output from the RD converter 20' varies with the number of revolutions of the resolver.

As described above, when the detection angle $\theta$ of the resolver is input to the RD converter, the output angle $\theta'$ of the RD converter varies with the number of revolutions of the resolver because of the angle error $\theta_e$ of the resolver.

Figure 7A:
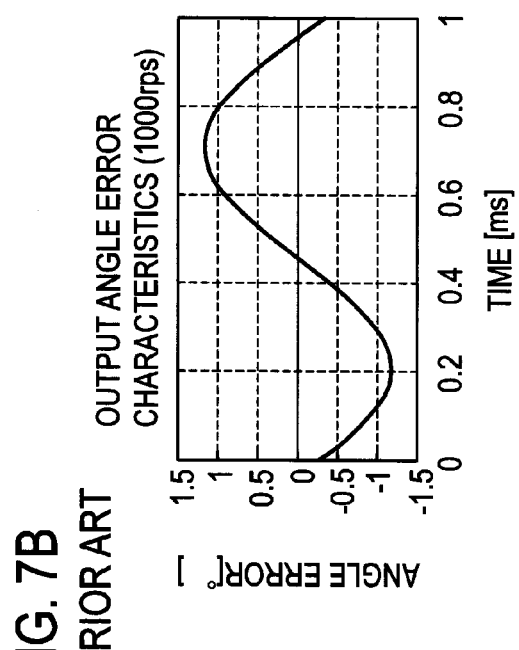
FIG. 7A is a graph showing the output angle error in the case where the conventional correction is performed in the RD converter having the characteristics shown in FIG. 4 at a rate of 10 rps.
Figure 7B:
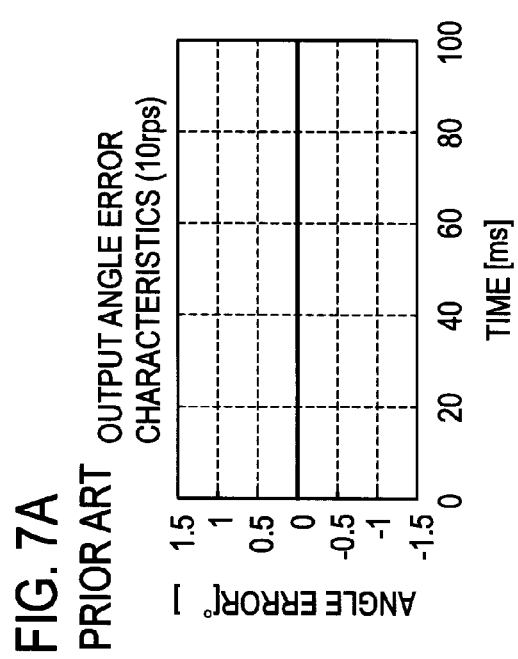
FIG. 7B is a graph showing the output angle error in the case where the conventional correction is performed in the RD converter having the characteristics shown in FIG. 4 at a rate of 1000 rps.

The method of correcting the angle error of the resolver described in Patent literature 1, which corrects the output angle of the RD converter, cannot correct the angle error that varies with the number of revolutions of the resolver. Thus, for example, when the RD converter having the characteristics shown in FIGS. 4A and 4B is used, and the correction data is created based on the angle errors calculated for a low number of revolutions (10 rps, for example), an error remains when the number of revolutions of the resolver is high (1000 rps, for example) as shown in FIGS. 7A and 7B.

In the following, embodiments of the present invention will be described.

Figure 8:
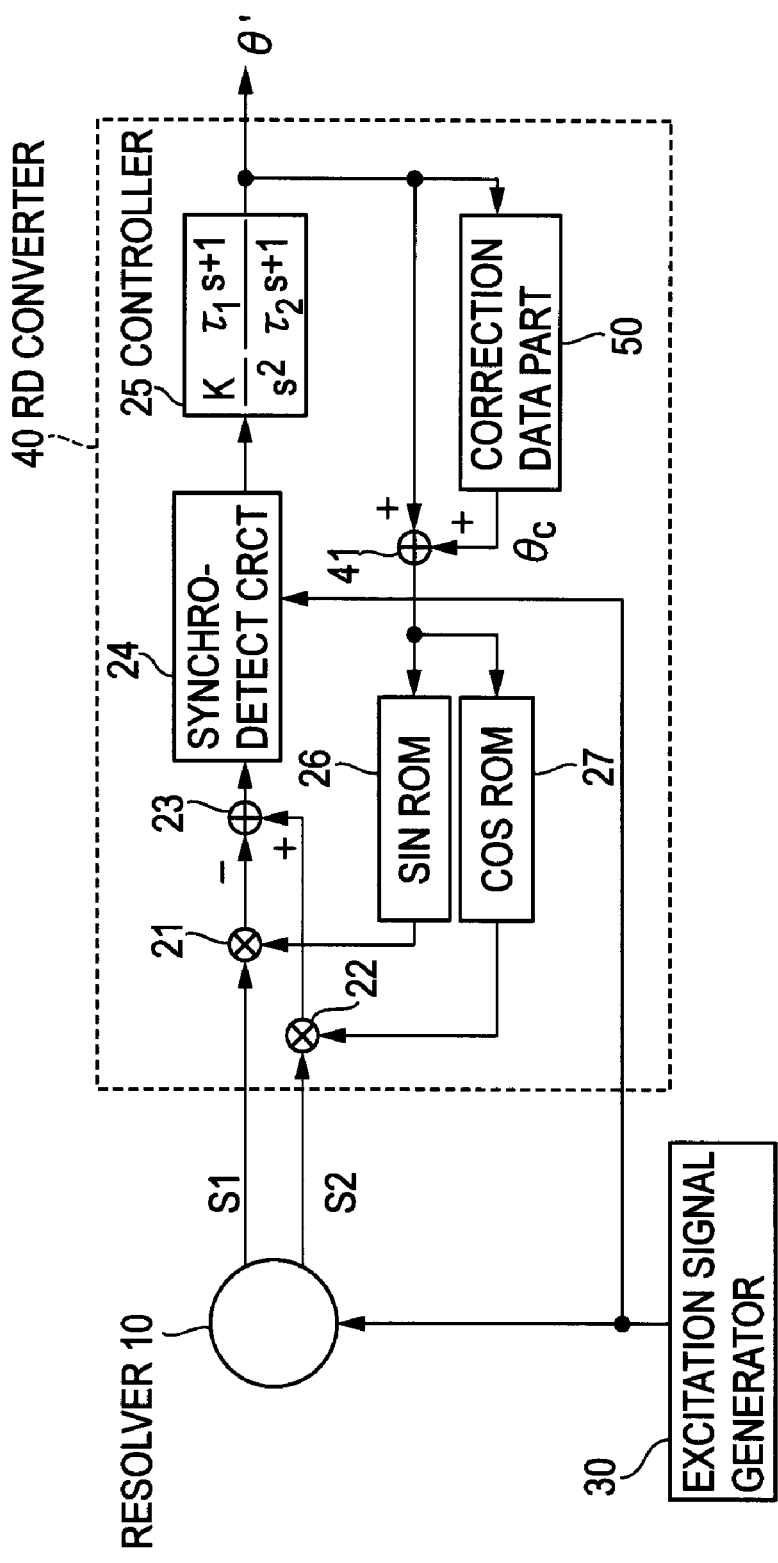
FIG. 8 is a block diagram showing a configuration of an RD converter according to an embodiment of the present invention.

FIG. 8 is a diagram showing a configuration of an RD converter according to an embodiment of the present invention along with a resolver and an excitement signal generator. The components corresponding to those in FIG. 1 are denoted by the same reference numerals, and detailed descriptions thereof will be omitted.

In this example, an RD converter 40 has a correction data part 50 in the angle calculation loop thereof, so that the angle error of the resolver 10 is corrected in the angle calculation loop.

The digital output angle $\theta'$ is input to the correction data part 50, and the correction data part 50 outputs a correction angle $\theta_c$ for the digital output angle $\theta'$. An adder 41 adds the correction angle $\theta_c$ to the digital output angle $\theta'$ and outputs the sum to the SIN ROM 26 and the COS ROM 27. The SIN ROM 26 produces a sine value of the input sum and outputs the sine value to the multiplier 21, and the COS ROM 27 produces a cosine value of the input sum and outputs the cosine value to the multiplier 22.

Figure 9:
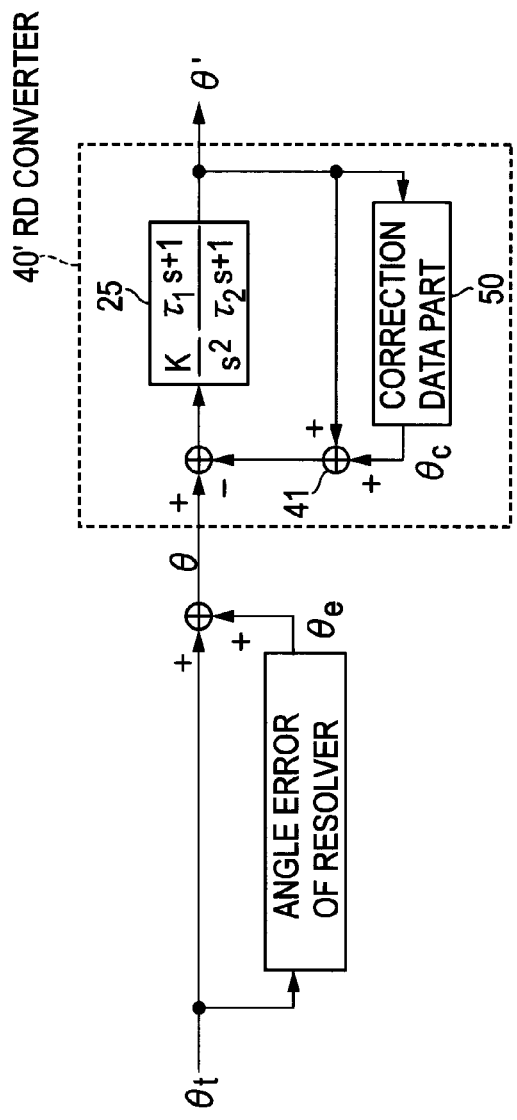
FIG. 9 is a block diagram showing a simplification of the configuration shown in FIG. 8.

As with the configuration described above with reference to FIG. 2, in the case where $\theta \approx \theta'$, the configuration shown in FIG. 8 can be simplified as shown in FIG. 9 on the assumption that $\sin(\theta-\theta')=\theta-\theta'$. The configuration shown in the block diagram of FIG. 9 can be further transformed into the configuration shown in FIG. 10.

Figure 10:
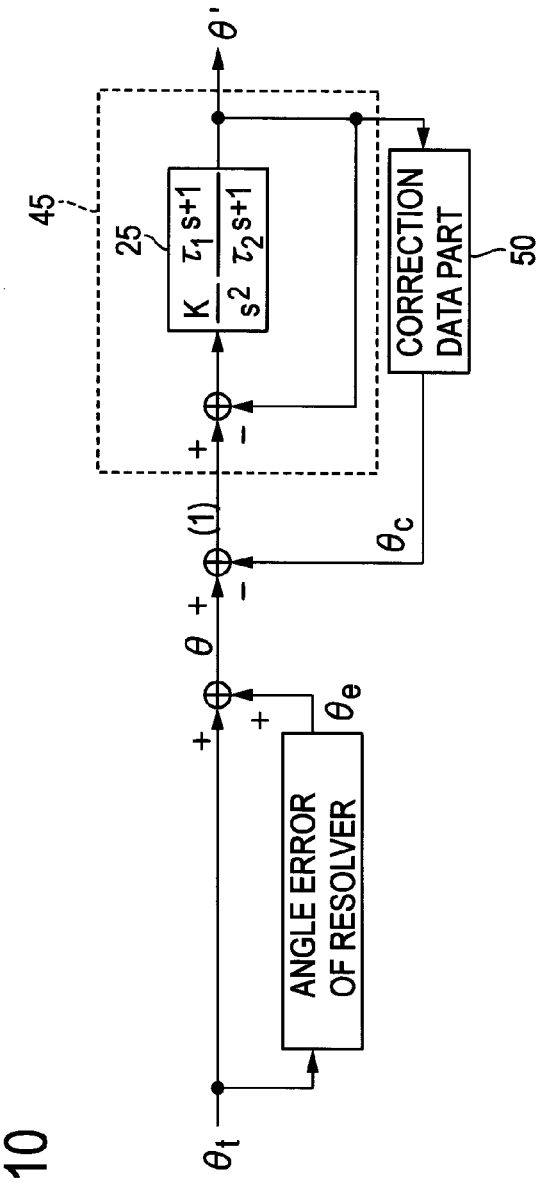
FIG. 10 is a block diagram showing a modification of the configuration shown in the block diagram of FIG. 9.

The signal (1) shown in FIG. 10 is expressed as:

$$\theta-\theta_c=\theta_t+\theta_e-\theta_c.$$

If the angle error $\theta_e$ is input to the correction data part 50 as correction data, $\theta_c$ equals to $\theta_e$, and thus, the signal (1) is expressed as $\theta_t$. Thus, with this configuration, the angle error $\theta_e$ of the resolver is removed from the angle input to an angle calculation loop 45.

Figure 11A:
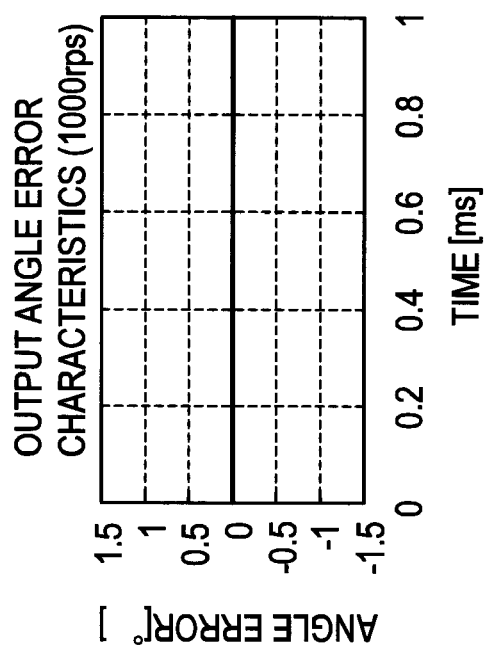
FIG. 11A is a graph showing results of angle error correction at a rate of 10 rps for the RD converter according to the present invention.
Figure 11B:
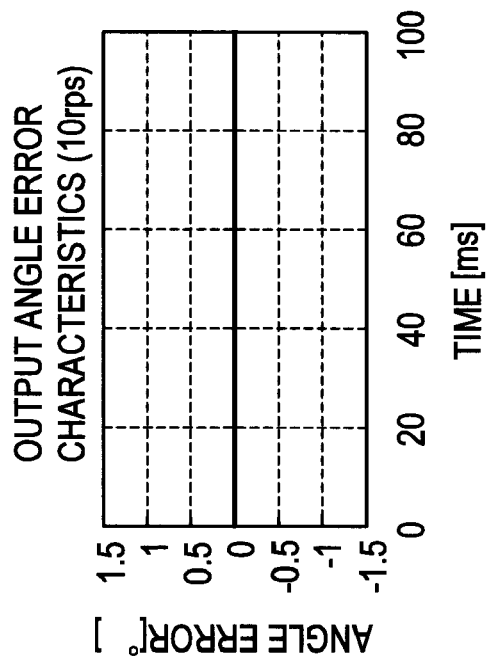
FIG. 11B is a graph showing results of angle error correction at a rate of 1000 rps for the RD converter according to the present invention.

The conventional correction method described in Patent literature 1 performs correction calculation at a stage following the RD converter (angle calculation loop) and therefore is influenced by the characteristics of the RD converter (angle calculation loop), so that the angle error characteristics varies at high numbers of revolutions, and the angle error of the resolver cannot be removed. However, the present invention removes the angle error at a stage preceding the angle calculation loop and therefore is not influenced by the characteristics of the angle calculation loop and can provide a precise result. FIGS. 11A and 11B show simulation results of correction according to the present invention in the cases where the number of revolutions of the resolver is 10 rps and where the number of revolutions of the resolver is 1000 rps.

The correction data part 50 described above can be implemented in the two different ways as will be explained below.

<Table Implementation>

According to this implementation, the correction data part 50 has a memory (RAM or ROM), in which the angle errors $\theta_e$ of the resolver are recorded. The memory can be configured to receive an angle as an address input and outputs an angle error as data output. The correction data part 50 having the memory thus configured retrieves the angle error $\theta_e$ associated with the input digital output angle $\theta'$ from the memory and outputs the angle error $\theta_e$ as the correction angle $\theta_c$.

Assuming that the maximum value of the angle error $\theta_e$ of the resolver is 1 degree, the bit length of the correction data of an RD converter having a 12-bit resolution is 4 bits, since $$360 \text{ degrees}/2^{12}=0.0879 \text{ degrees, and}$$

$$1 \text{ degree}/0.0879 \text{ degrees}=11.4.$$

Therefore, the correction data table requires a memory capacity of $2^{12} \times 4$ bits=16384 bits, which is one third of the conventionally required memory capacity.

<Calculator Implementation>

According to this implementation, each correction angle $\theta_c$ is calculated from the output angle $\theta'$ of the RD converter.

Figure 12:
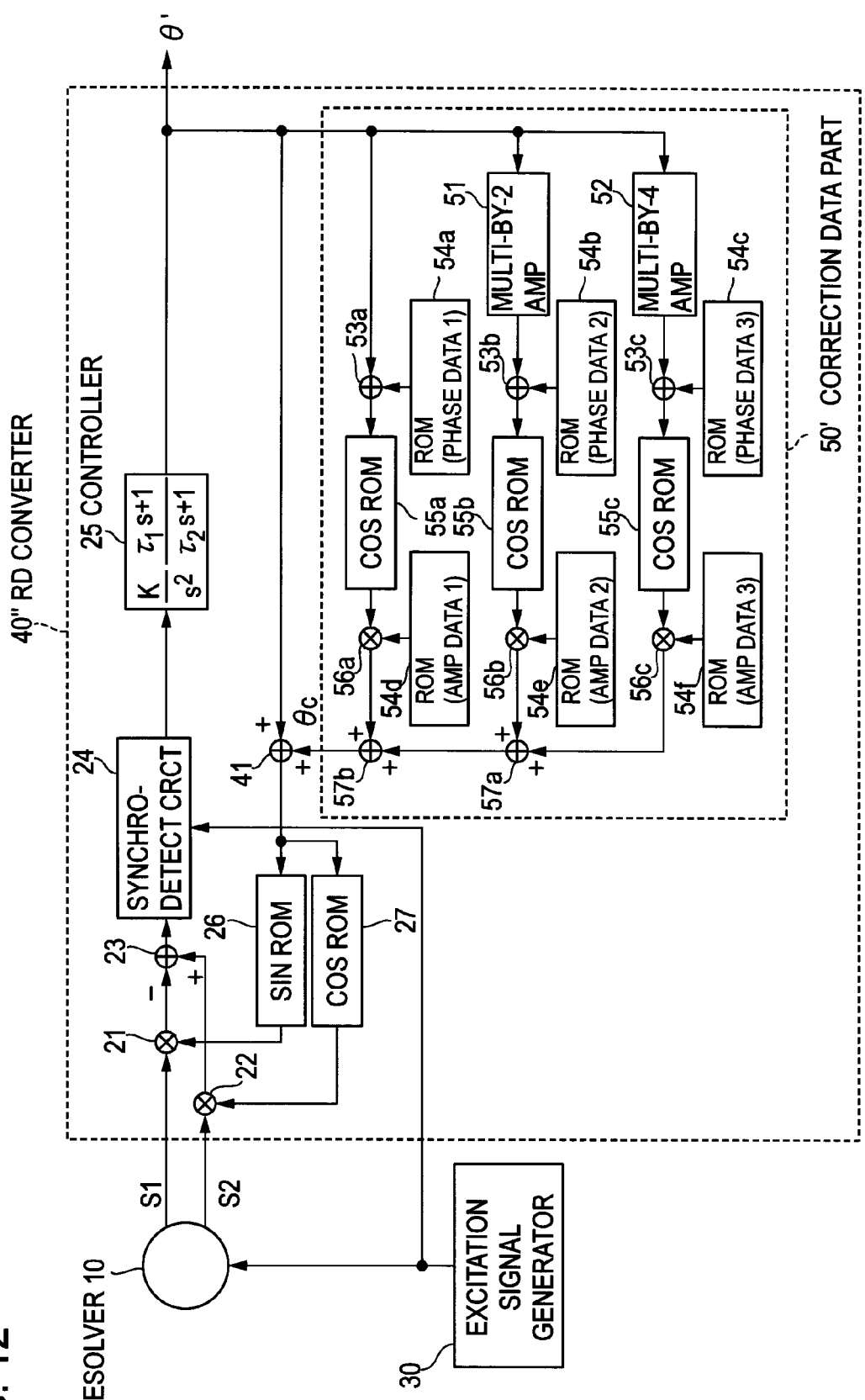
FIG. 12 is a block diagram showing a configuration of an RD converter according to another embodiment of the present invention.

Typically, the angle error of the resolver includes integral multiple frequency components of the number of revolutions of the resolver in addition to the fundamental frequency component, and the error is mainly in the shape of the first harmonic, the second harmonic and the fourth harmonic. Therefore, the correction data part that calculates the correction angle $\theta_c$ can be configured as shown in FIG. 12.

In this example, a correction data part 50' comprises a multiply-by-two amplifier 51, a multiply-by-four amplifier 52, adders 53a to 53c, ROMs 54a to 54f, COS ROMs 55a to 55c, multipliers 56a to 56c and adders 57a to 57b.

The digital output angle $\theta'$ is input to the multiply-by-two amplifier 51, and the multiply-by-two amplifier 51 generates an angle twice as large as $\theta'$. Similarly, the digital output angle $\theta'$ is also input to the multiply-by-four amplifier 52, and the multiply-by-four amplifier 52 generates an angle four times as large as $\theta'$.

The ROMs 54a to 54c store phase data 1 to 3 about the first harmonic (fundamental frequency component) and the second harmonic and the fourth harmonic (integral multiple frequency components) of the angle error of the resolver 10, respectively. The ROMs 54d to 54f store amplitude data 1 to 3 about the first harmonic, the second harmonic and the fourth harmonic of the angle error of the resolver 10, respectively.

Based on the amplitude and the phase stored in the ROMs 54a to 54f, the correction data part 50' calculates the first harmonic, the second harmonic and the fourth harmonic cosine waves of the input digital output angle $\theta'$ and outputs the sum of the cosine waves as the correction angle $\theta_c$.

Since the correction angle $\theta_c$ is produced by calculating the first, second and fourth harmonic cosine waves of the digital output angle θ', only six pieces of data including three pieces of amplitude data and three pieces of phase data (each having a data length of 12 bits) are required. Thus, the required memory capacity can be reduced to 72 bits (6×12 bits).

The correction data part 50' shown in FIG. 12 has a possible increase of numbers of adders (53a to 53c), multipliers (56a to 56c) and COS ROMs (55a to 55c), causing an increase in circuit scale (number of components and circuit area). Thus, in the light of a reduction of the increase in circuit scale, the correction data part 50' can perform the calculation in a time divisional manner.

Figure 13:
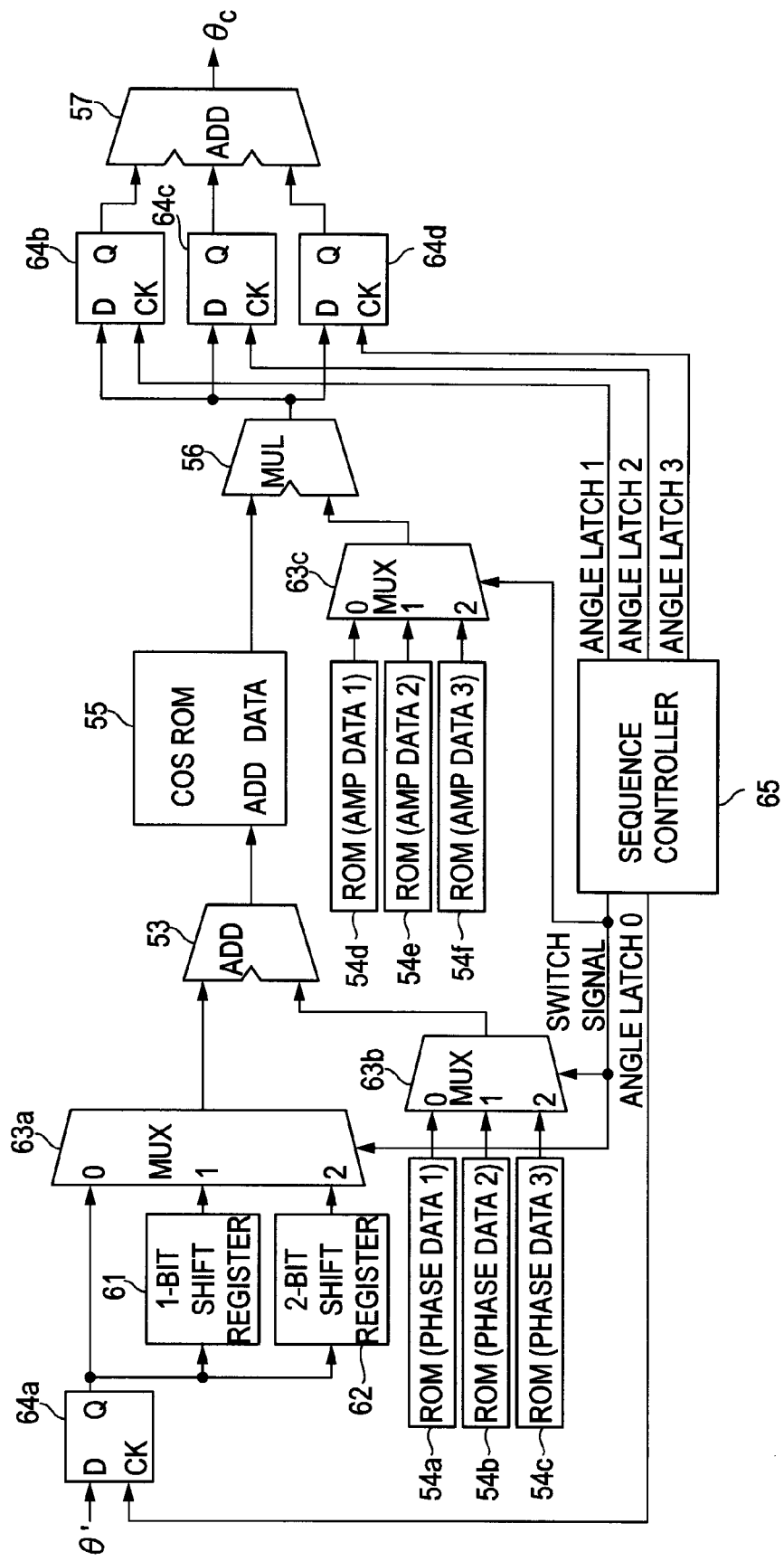
FIG. 13 is a diagram showing a circuit configuration of a correction data part in FIG. 12 designed for a time divisional processing.
Figure 14:
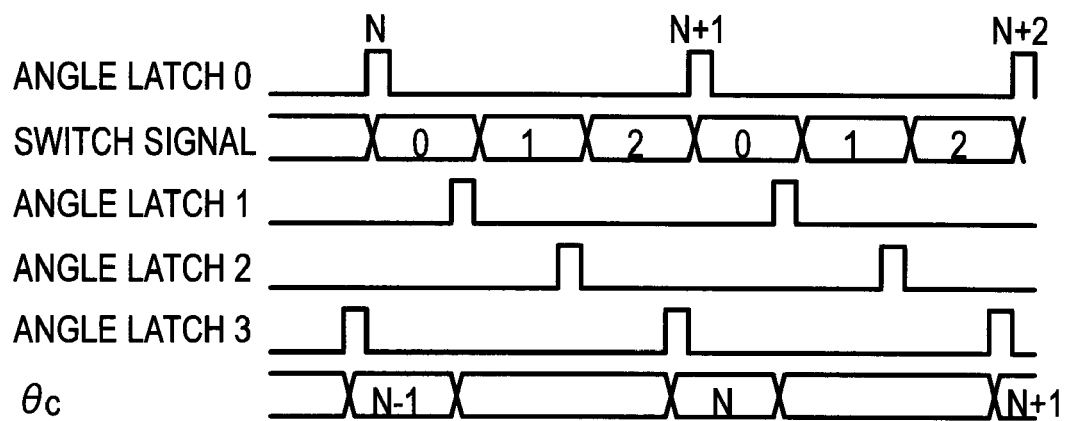
FIG. 14 is a timing chart for the correction data part shown in FIG. 13.

FIG. 13 shows a circuit configuration of a correction data part 50'' that performs the calculation of the correction angle $\theta_c$ in a time divisional manner. FIG. 14 is a timing chart for the correction data part 50''. In FIG. 13, reference numeral 61 denotes a 1-bit shift register, and reference numeral 62 denotes a 2-bit shift register. Reference numerals 63a to 63c denote multiplexers, reference numerals 64a to 64d denote D flip-flops, and reference numeral 65 denotes a sequence controller.

If the circuit shown in FIG. 13 is driven according to the timings shown in FIG. 14, a single adder (ADD) 53, a single COS ROM 55 and a single multiplier (MUL) 56 suffice. Thus, the increase of the circuit scale can be suppressed.

Next, generation of the correction data recorded in the correction data parts 50 and 50' (50'') will be described.

Figure 15:
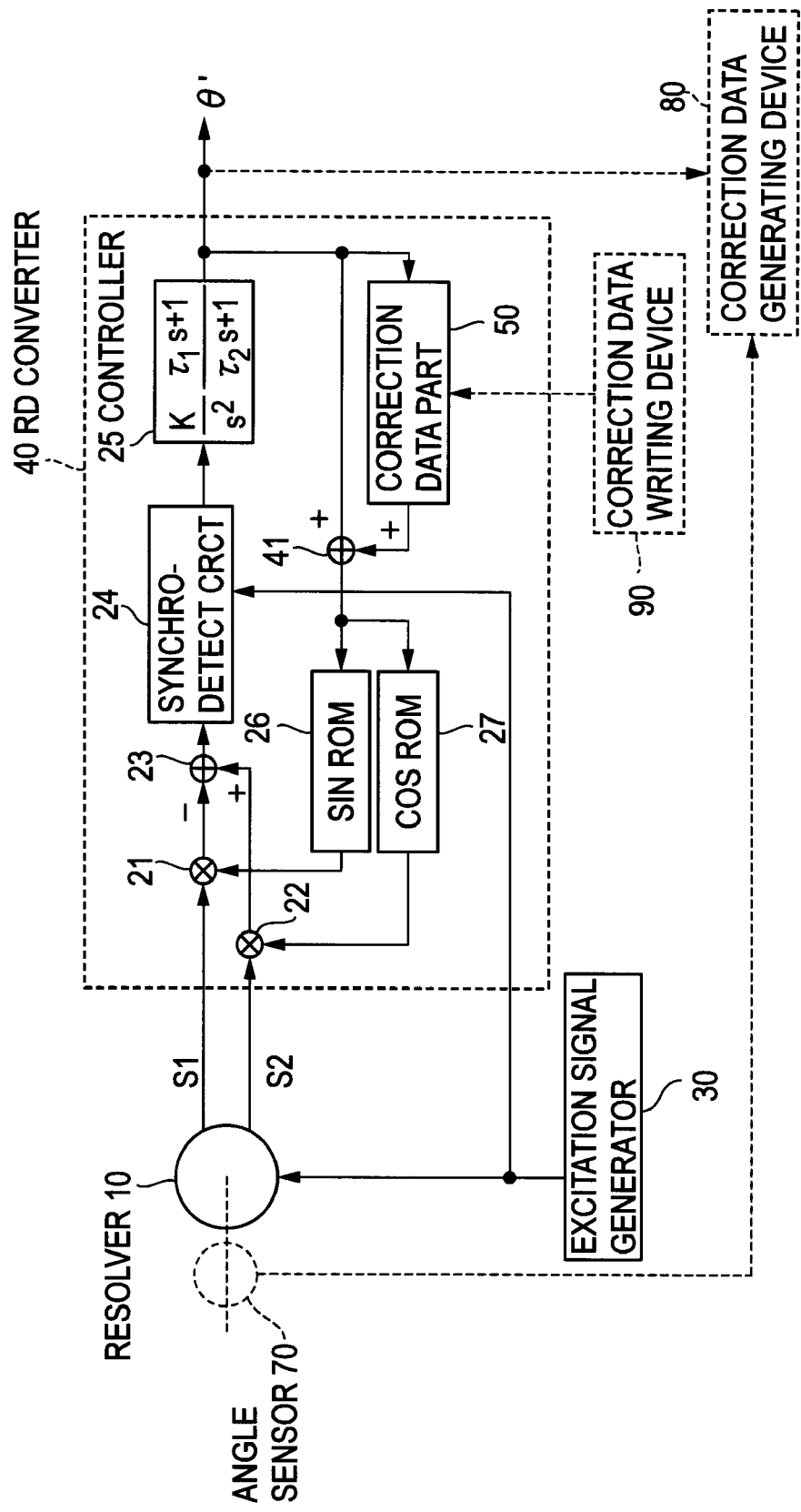
FIG. 15 is a block diagram for illustrating generation and writing of correction data.
Figures 16, 17:
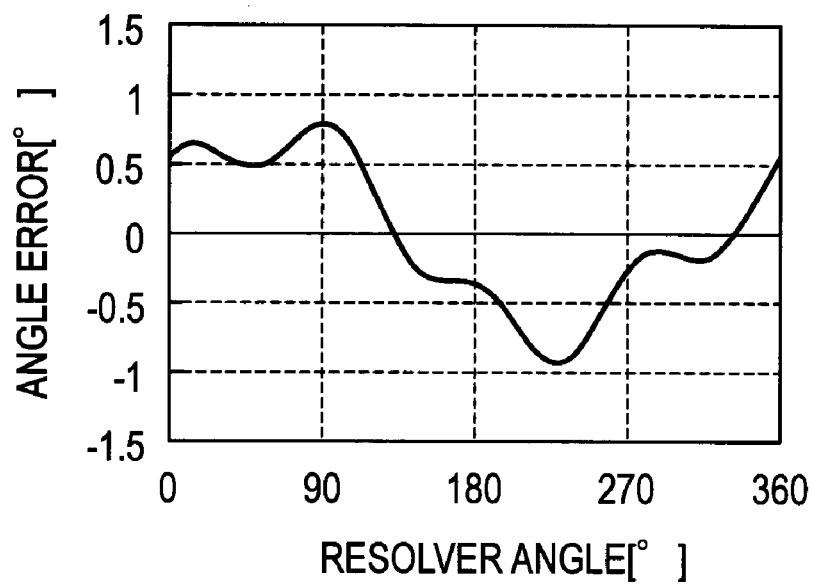
FIG. 16 is a graph showing an example of the angle error characteristics of the resolver.
FIG. 17 is a table showing an example of correction data in the case of a calculator implementation of the correction data part.

As illustrated in FIG. 15, an angle sensor 70 that produces an angle reference, such as a rotary encoder, is attached to the rotary shaft of the resolver 10, and the output of the angle sensor 70 and the digital output angle θ' of the RD converter 40 are input to a correction data generating device 80. Angle error data about the resolver 10 is generated by calculating the difference between the output of the angle sensor 70 and the digital output angle θ' while the resolver 10 is rotating at a low speed (around 1 rps). FIG. 16 shows an example of the angle error data.

In the case of the correction data part 50 implemented as a table, the data shown in FIG. 16 is used as the correction data.

On the other hand, in the case of the correction data parts 50' and 50'' implemented as a calculator shown in FIGS. 12 and 13, the data shown in FIG. 16 is subjected to fast Fourier transform (FFT). FFT results data shown in the table of FIG. 17, and the data is used as the correction data.

Once the correction data is acquired, a correction data writing device 90 writes the correction data to the correction data part 50 (or the ROMs 54a to 54f of the correction data part 50' or 50'').

In practical operation, the angle sensor 70, the correction data generating device 80 and the correction data writing device 90 are not necessary, and the RD converter outputs the output angle θ' corrected for the angle error of the resolver 10.

In the case where RAMs are used in the correction data part instead of the ROMs, no data is recorded at the time of power-on, and thus, the correction data writing device 90 writes the correction data to the RAMs.

For the correction data, ROMs can be used in the case where the angle error characteristics of the resolver are fixed. However, RAMs are preferably used so that the correction data can be externally rewritten in the case where the angle error characteristics are variable.

As described above, according to the present invention, a function that corrects the angle error of the resolver is additionally provided in the RD converter, and correction is performed in the angle calculation loop. Thus, the RD converter can precisely correct the angle error that varies depending on the number of revolutions of the resolver and output a precise angle from which the angle error is removed.

In addition, the angle detecting apparatus provided with this RD converter, the resolver and the excitation signal generator can precisely detect the rotational angle of a motor.

What is claimed is:

1. An RD converter that converts a detection angle θ indicated by resolver signals S1 and S2 output from a one phase excitation/two phase output resolver into a digital output angle θ', comprising:
   a first multiplier that multiplies said resolver signal S1 by an output of a SIN ROM;
   a second multiplier that multiplies said resolver signal S2 by an output of a COS ROM;
   a subtractor that subtracts an output of said first multiplier from an output of said second multiplier;
   a synchronous detecting circuit that synchronously detects an output of said subtractor with reference to an excitation signal;
   a controller that controls said digital output angle θ' to make an output of said synchronous detecting circuit equal to zero and outputs the controlled digital output angle θ';
   a correction data part that receives said digital output angle θ' and outputs a correction angle for the digital output angle θ';
   an adder that adds said digital output angle θ' and said correction angle and outputs the sum to said SIN ROM and said COS ROM;
   said SIN ROM that produces a sine value of said sum and outputs the sine value; and
   said COS ROM that produces a cosine value of said sum and outputs the cosine value;
   wherein said correction data part:
   stores amplitudes and phases of an angle error of a fundamental frequency component and an integral multiple frequency component of the number of revolutions of said resolver,
   produces a fundamental frequency cosine wave and an integral multiple frequency cosine wave of said input digital output angle θ' based on the amplitude and the phase, and
   outputs the sum of the cosine waves as said correction angle.

2. The RD converter according to claim 1, wherein a transfer function of said controller is $(K/s^2)*\{(\tau_1 s+1)/(\tau_2 s+1)\}$.

3. The RD converter according to claim 1 or 2 in an angle detecting apparatus, the angle detecting apparatus further comprising:
   a one phase excitation/two phase output resolver; and
   an excitation signal generator that supplies an excitation signal to said resolver and said RD converter.

* * * * *